(12) United States Patent
Sankman

(10) Patent No.: US 6,632,734 B2
(45) Date of Patent: Oct. 14, 2003

(54) PARALLEL PLANE SUBSTRATE

(75) Inventor: Robert L. Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/371,256

(22) Filed: Feb. 21, 2003

(65) Prior Publication Data

US 2003/0127742 A1 Jul. 10, 2003

Related U.S. Application Data

(62) Division of application No. 09/741,206, filed on Dec. 19, 2000.

(51) Int. Cl.$^7$ ............................................. H01L 21/4763
(52) U.S. Cl. ....................... 438/622; 438/737; 438/761
(58) Field of Search ................................ 438/622, 729, 438/737, 761; 257/700, 211, 266, 324, 635, 758

(56) References Cited

U.S. PATENT DOCUMENTS

| | | | |
|---|---|---|---|
| 5,363,275 A | * 11/1994 | Frankeny et al. | ............ 361/749 |
| 6,075,427 A | 6/2000 | Tai et al. | |
| 6,165,892 A | * 12/2000 | Chazan et al. | ............... 438/623 |
| 6,353,540 B1 | * 3/2002 | Akiba et al. | ................. 361/794 |

FOREIGN PATENT DOCUMENTS

| | | |
|---|---|---|
| DE | 1 930 642 | 1/1971 |
| DE | 1 765 083 A | 7/1971 |
| DE | 37 09 770 A1 | 10/1988 |
| EP | 1 028 607 A1 | 8/2000 |
| GB | 2 132 411 A | 7/1984 |
| JP | 01 124296 A | 5/1989 |
| JP | 10 270809 A | 10/1998 |
| JP | 11 233917 | 8/1999 |

OTHER PUBLICATIONS

R.H. Reynolds, "Microthin–Microordinate Circuit Board," IBM Technical Disclosure Bulletin, vol. 9, No. 3, Aug. 1, 1966, pp. 250–251, XP002196415, New York, USA.

"Circuitry Device for Dense First and Second Level Packaging," IBM Technical Disclosure Bulletin, vol. 31, No. 4, Sep. 1, 1988, pp. 222–224, XP000021608, ISSN: 0018-8689, New York, USA.

* cited by examiner

*Primary Examiner*—David Nelms
*Assistant Examiner*—Long Tran
(74) *Attorney, Agent, or Firm*—Robert G. Winkle

(57) ABSTRACT

A microelectronic substrate having a plurality of alternating substantially planar layers of dielectric material and conductive material, and further having a first surface and a second surface, wherein the dielectric material and the conductive material layers extend substantially perpendicularly between the first and second surfaces.

9 Claims, 14 Drawing Sheets

PARALLEL PLANE SUBSTRATE

The present patent application is a Divisional of application Ser. No. 09/741,206, filed Dec. 19, 2000.

BACKGROUND OF THE INVENTION

1. Field of the Invention

The present invention relates to apparatus and methods for fabricating a conductive substrate. In particular, the present invention relates to a laminated substrate, formed from alternating conductive and dielectric material layers, which may be used as an interposer.

2. State of the Art

Higher performance, lower cost, increased miniaturization of integrated circuit components, and greater packaging density are ongoing goals of the computer industry. As these goals are achieved, microelectronic dice become smaller. A smaller size allows more microelectronic dice to be produced on each semiconductor wafer, which reduces the cost of each microelectronic die. However, the small size of each microelectronic die makes it difficult to directly incorporate them into microelectronic devices. Thus, a microelectronic die may be attached to an interposer to allow for easier connection of the microelectronic die to other device components.

FIG. 18 illustrates a package 200 comprising a microelectronic die 202 electrically connected to an interposer 204. The interposer 204 comprises a substrate core 206 (e.g., bismaleimide triazine resin, FR4, polyimide materials, and the like) having dielectric layers (e.g., epoxy resin, polyimide, bisbenzocyclobutene, and the like) and conductive traces (e.g., copper, aluminum, and the like) on a top surface thereof to form a top trace network 212, and dielectric layers and conductive traces on a bottom surface thereof to form a bottom trace network 214. To achieve electrical interconnect between the top trace-network 212 and the bottom trace network 214, holes are drilled through the substrate core 206 in specific locations and these holes are plated with a conductive material. The resulting plated holes are known in the art as "plated through-hole (PTH)" vias 218. FIG. 19 illustrates the interposer 204 with the top trace network 212 and the bottom trace network 214 on the substrate core 206. The top trace network 212 comprises a first dielectric layer 222 having first conductive traces 224 formed thereon, wherein the first conductive traces 224 extend through the first dielectric layer 222 to contact the PTH vias 218 or traces 226 which contact the PTH vias 218. A second dielectric layer 222' is disposed over the first dielectric layer 222 and the first conductive traces 224. Second conductive traces 224' are formed on the second dielectric layer 222', wherein the second conductive traces 224' extend through the second dielectric layer 222' to contact a respective first conductive trace 224. A third dielectric layer 222" is disposed over the second dielectric layer 222' and the second conductive traces 224', and first solder ball lands 228 are formed to extend through the third dielectric layer 222". A first solder resist 232 is formed over the third dielectric layer 222" to surround the first solder ball lands 228. The bottom trace network 214 is formed in a similar fashion as the top trace network 212 with first, second, and third dielectric layers (234, 234', and 234", respectively) and first, second, and third conductive traces (236, 236', and 236", respectively), wherein second solder ball lands 238 are formed with the third conductive traces 236" and a second solder resist 242 is formed over the third dielectric layer 234" and a portion of the third conductive trace 236" to surround the second solder ball lands 238.

Referring to FIG. 18, the microelectronic die 202 is attached to and in electrical contact with the top trace network 212 through small solder balls 244. The small solder balls 244 extend between contacts 246 on the microelectronic die 202 and the first solder ball lands 228 (see FIG. 19). External contacts 248 (shown as solder balls) are formed on the second solder ball lands 238 (see FIG. 19). The external contacts 248 are attached to an external electrical system (not shown). Thus, the use of the interposer 204 allows electrical communication between the microelectronic die 202 and external electrical system (not shown)

FIGS. 20–24 illustrate a panel plating, method of forming a copper plated through-hole via, such as shown as the PTH vias 218 in FIGS. 18 and 19. As shown in FIG. 20, a first copper layer 252 disposed on a first surface 254 of the substrate 206 and a second copper layer 256 disposed on a second surface 258 of substrate 206. A hole 262 is drilled through the first copper layer 252, the substrate 206, and the second copper layer 256, as shown in FIG. 21. As shown in FIG. 22, a copper sidewall layer 264 is formed on a sidewall(s) 266 of the hole 262 with an electrodeless copper plating technique followed by a copper electroplatin process, as known in the art. A resist layer 268 is patterned over the hole 262 (see FIG. 22) and a portion of the first copper layer 252 and the second copper layer 256, as shown in as FIG. 23. The first copper layer 252 and the second copper layer 256 are then etched and the resist layer 268 is removed to form a plated through-hole via 218, as illustrated in FIG. 24.

The fabrication of the interposer 204 requires a number of processing steps which increases the cost of the package. In particular, the formation of the PTH vias 218 has numerous, time-intensive processing steps. Therefore, it would be advantageous to design an interposer and a technique for fabrication the same which eliminates the need for forming PTH vias.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
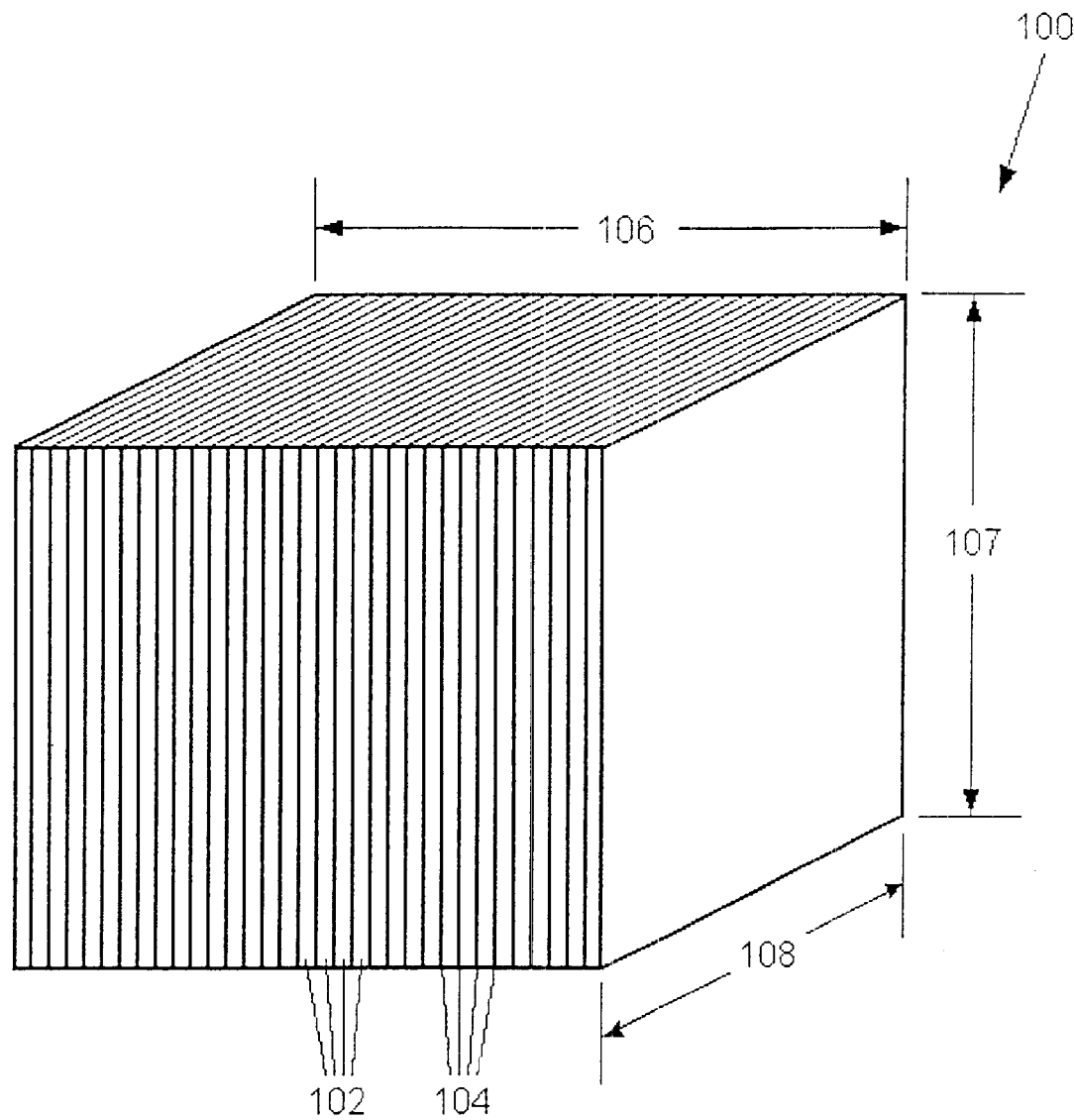
FIG. 1 is an oblique view of a parallel conducting plane substrate block, according to the present invention.

In the following detailed description, reference is made to the accompanying drawings that show, by way of illustration, specific embodiments in which the invention may be practiced. These embodiments are described in sufficient detail to enable though skilled in the art to practice the invention. It is to be understood that the various embodiments of the invention, although different, are not necessarily mutually exclusive. For example, a particular feature, structure, or characteristic described herein, in connection with one embodiment, may be implement within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, alone with the full range of equivalents to which the claims are entitled. In the drawings, like numerals refer to the same or similar functionality throughout the several views. Furthermore, the drawings are not meant illustrate any scale of the present invention but are merely illustrative of the general concept of the present invention.

FIG. 1 illustrates a parallel plane substrate block 100, according to the present invention. The parallel plane substrate block 100 comprises alternating substrate dielectric material layers 102 and substrate conductive material layers 104. The substrate dielectric material layers 102 may include, but are not limited to, filled epoxy resin, FR4, polyimide, bisbenzocyclobutene, ceramic materials, and the like. The substrate conductive material layers 104 may include, but are not limited to, copper, copper alloys, aluminum, aluminum alloy, tungsten, tungsten alloys, and the like. The parallel plane substrate block 100 may preferably be between about 2" and 12" thick 106, high 107, and deep 108.

Figure 2:
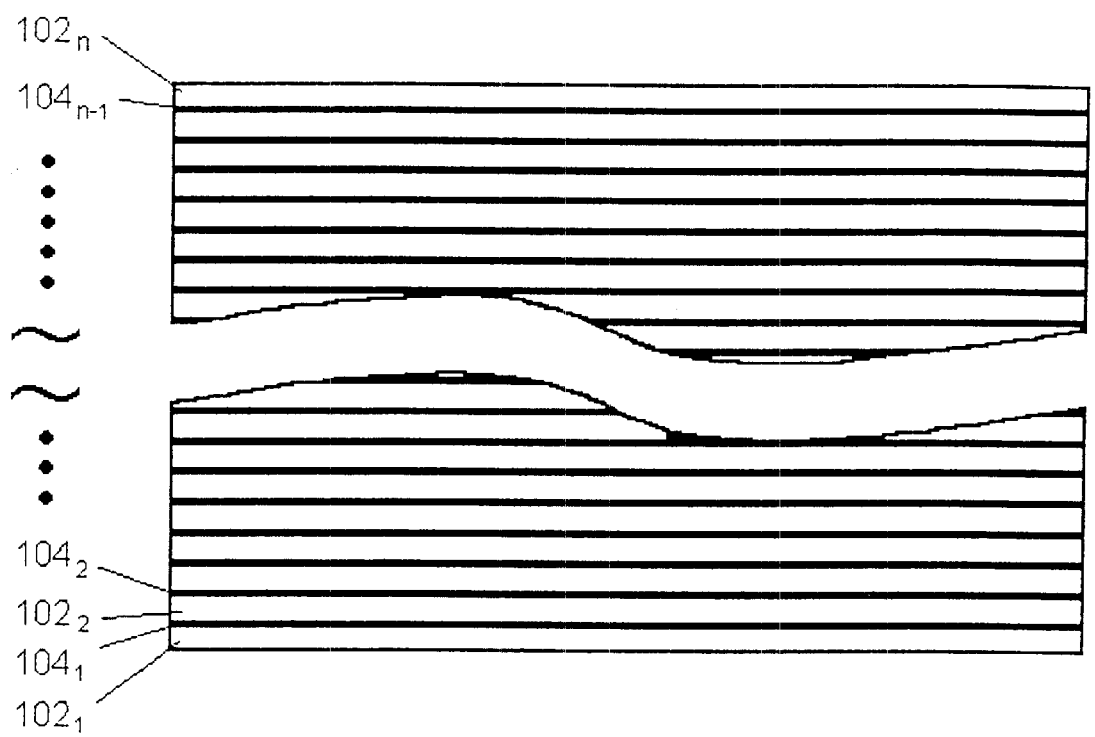
FIG. 2 is a side cross-sectional view of the parallel plane substrate block of FIG. 1, according to the present invention.

As shown in FIG. 2, the substrate block 100 is formed by providing a first layer of substrate dielectric material $102_1$, and disposing a first substrate conductive material layer $104_1$ over said first substrate dielectric material $102_1$. A second substrate dielectric material layer $102_2$ is disposed over the first substrate conductive material layer $104_1$ and a second substrate conductive material layer $104_2$ is disposed over the second substrate dielectric material layer $102_2$. This process is repeated until a desired number of substrate dielectric material layers $102_n$, and a desired number of substrate conductive material layers $104^{n-1}$ are formed. This results in the formation of the substrate block 100 that is essentially a lamination of dielectric and conductive material layers. It is, of course, understood that each substrate dielectric material layer 102 may comprise a plurality of dielectric material layers, and that each substrate conductive material layer 104 may comprise a plurality of conductive material layers.

Preferably, a filled epoxy resin is deposited with a thin copper foil disposed thereon in a sequential lamination repeated to form a 25-layer block (12 layers of copper foil and 13-layers of filled epoxy resin). There after, the 25-layer blocks are pressed in a lamination process well known to those experienced in the art. Individual 25-layer blocks are then aligned with one another and laminated to each other to form the parallel plane substrate block 100. Other means of lamination with block layer counts of greater than or less than 25 are possible. The critical factor required during lamination is the maintenance of a well-controlled dielectric-material thickness, which is uniform between the many layers contained in the block.

Figure 3:
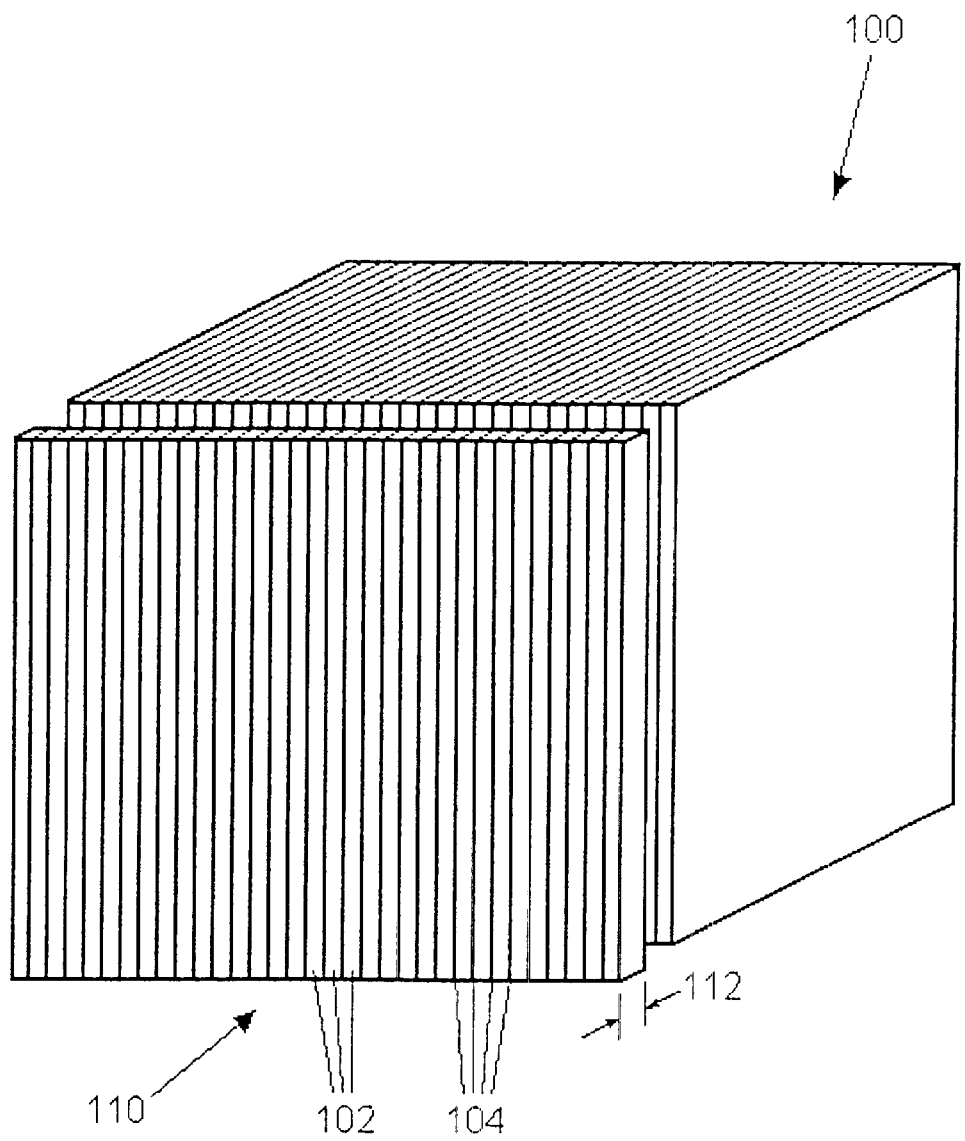
FIG. 3 is an oblique view of a parallel plane substrate having been cut from the block of FIG. 1, according to the present invention.
Figure 4:
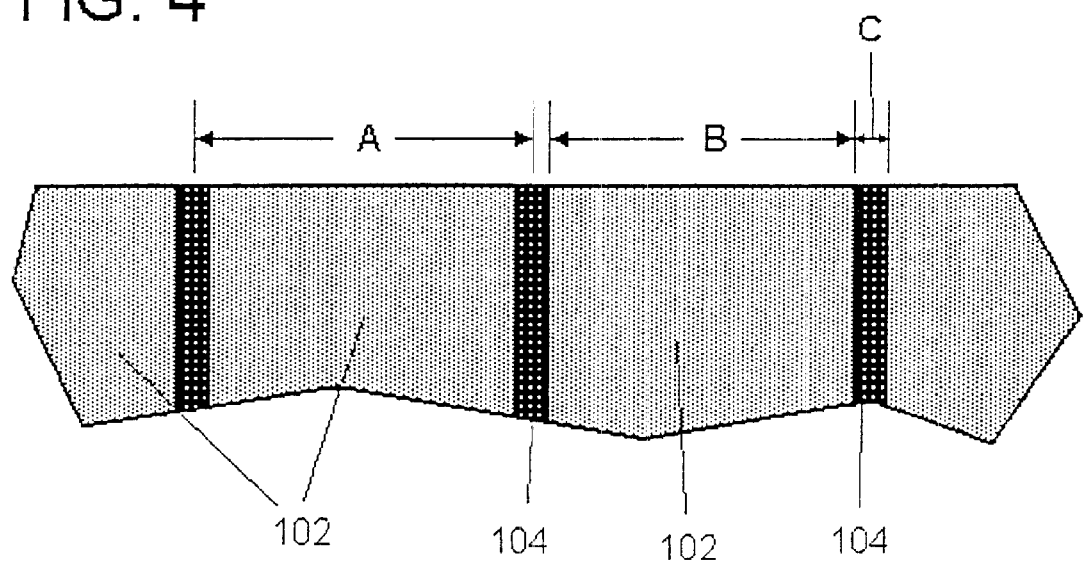
FIG. 4 is a side cross-sectional view of a parallel plane substrate, according to the present invention.

As shown in FIG. 3, the substrate block 100 is sliced perpendicular to the laminated substrate dielectric material layers 102 and substrate conductive material layers 104 to form a parallel plane substrate 110. Slicing the parallel plane substrate 110 in this manner results in each of the substrate dielectric material layers 102 and each of the substrate conductive material layers 104 extending from a first surface 116 of the parallel plane substrate 110 to an opposing second surface 130 of the parallel plane substrate 110 (shown in FIG. 5). The slicing may be achieved with any appropriate cutting device known in the art, including but not limited to, diamond saws and water saws. The parallel plane substrate 110 preferably has a thickness 112 of between about 0.5 mm and 3 mm, most preferably about 1 mm. As shown in FIG. 4, the parallel plane substrate 110 is preferably designed such that the substrate conductive material layers 104 are on approximately a 0.3175 mm (12.5 mil) pitch "A" in order to assist in forming a 50 mil pitch ball grid array package,as known in the art. Preferably, the substrate dielectric material layers 102 have a thickness "B" of about 0.2825 mm (11.12 mils) and the substrate conductive material layers 104 have a thickness "C" of about 0.035 mm (1.38 mils).

Figure 5:
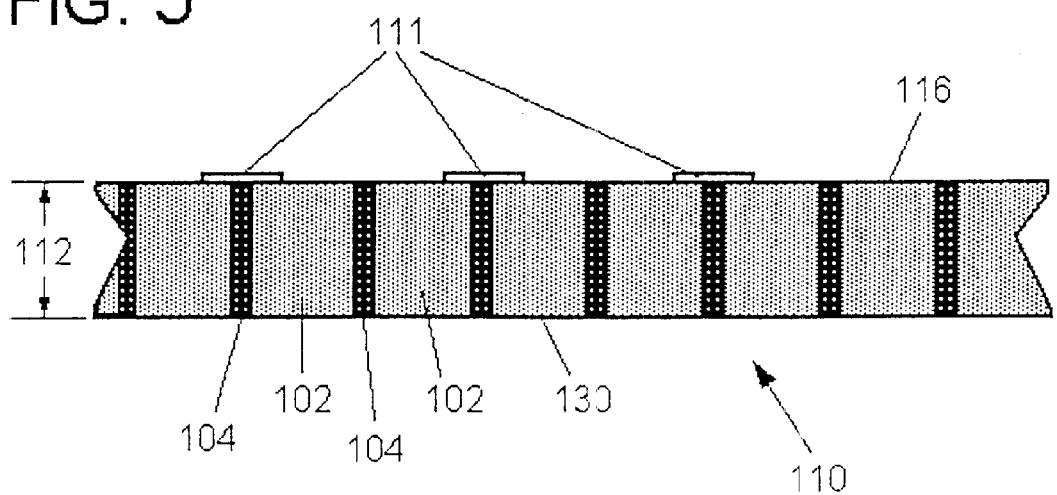
FIGS. 5–12 are side cross-sectional views of a method of forming an interposer using a parallel plane substrate, according to the present invention.

The parallel plane substrate 110 may be used as a substrate core in an interposer. FIGS. 5–12 illustrate the fabrication of such an interposer. As shown in FIG. 5, at least one conductive land 111 is formed on the parallel plane substrate first surface 116 at desired locations. The conductive lands 111 contact individual respective substrate conductive material layers 104 in a substantially perpendicular orientation. The conductive lands 111 may be formed by any technique known in the art. Preferably, the conductive lands 111 are formed of copper with any known panel plating technique.

Figure 6:
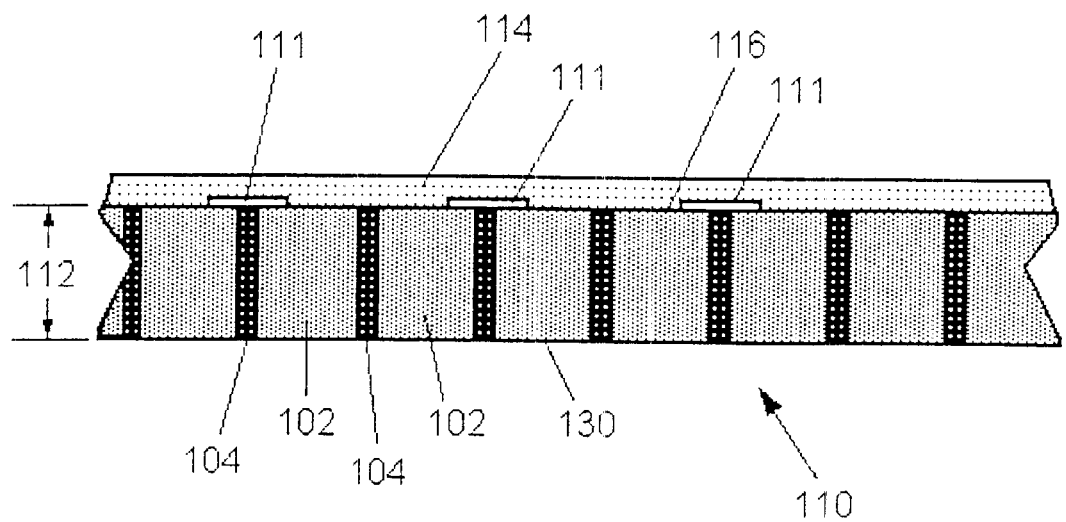
Figure 7:
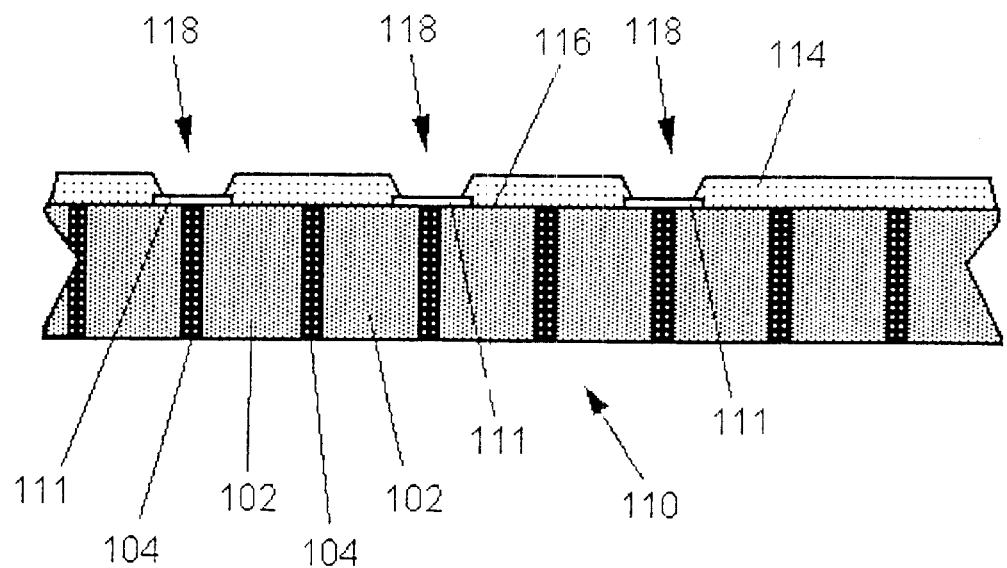

As shown in FIG. 6, a first dielectric material layer 114 is the disposed over the parallel plane substrate first surface 116 and the conductive lands 111. As shown in FIG. 7, at least one via 118 is formed through the first dielectric material layer 114 to expose at least a portion of at least one substrate conductive material layer 104. The vias 118 can be formed by any known technique including, but not limited to, laser drilling and etching.

Figure 8:
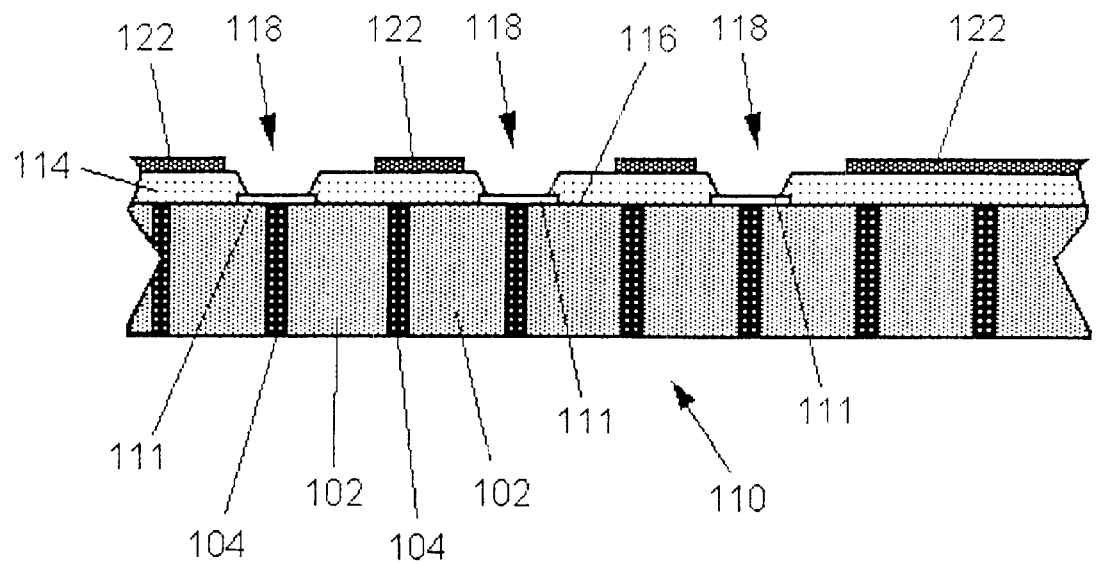
Figure 9:
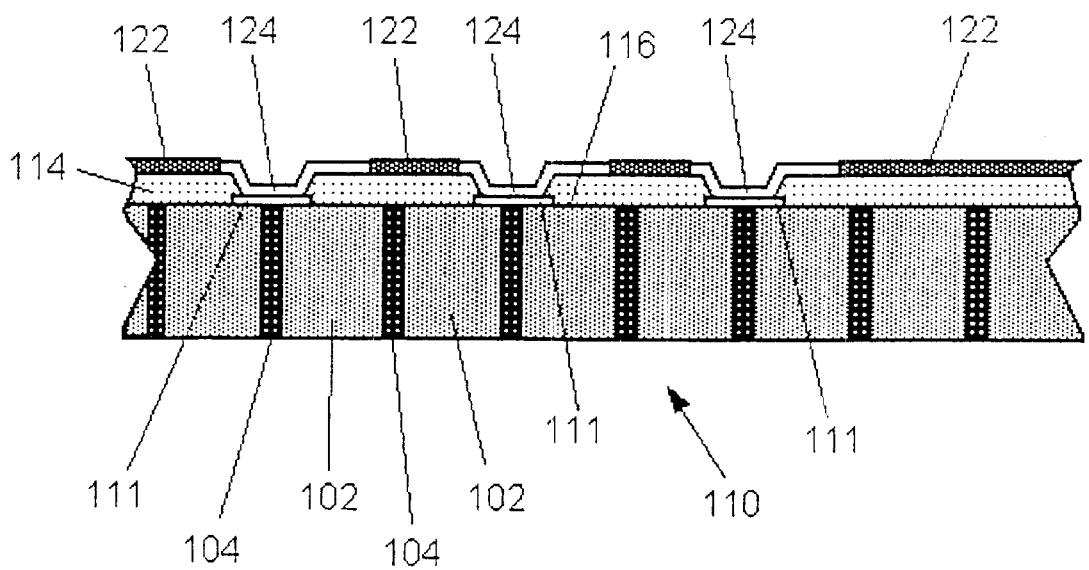
Figure 10:
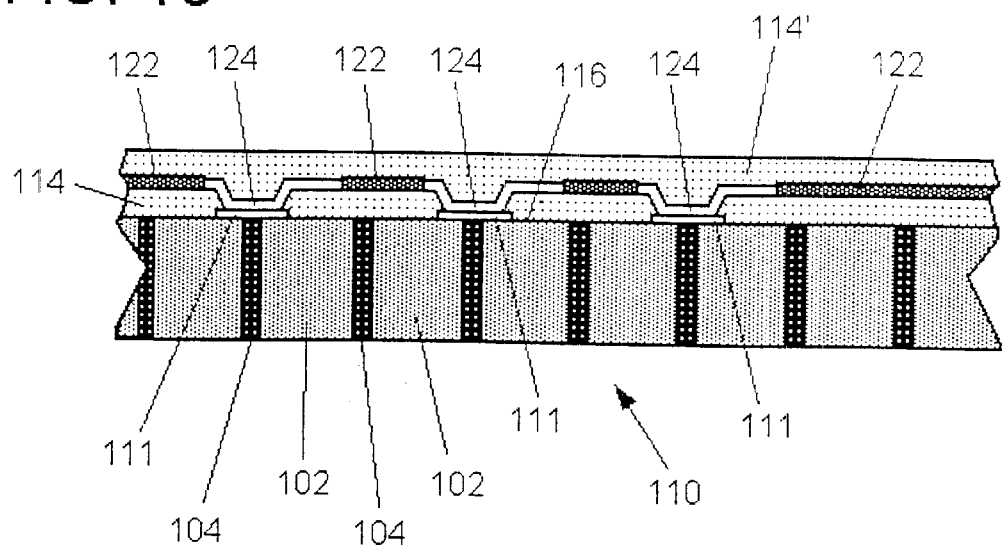
Figure 11:
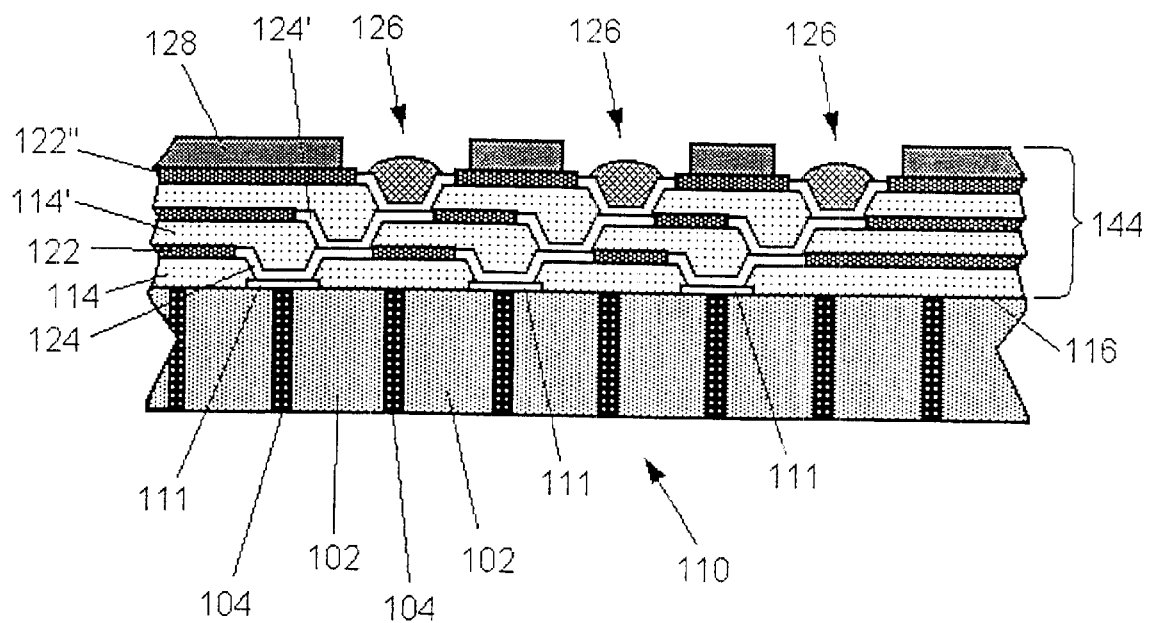

A first resist layer 122 is then patterned on the first dielectric material layer 114, as shown in FIG. 8. At least one first conductive trace 124 is formed on portions of the first dielectric material layer 114 not covered by the patterned first resist layer 122 and extends through the first dielectric material layer 114 to contact a respective substrate conductive material. layer 104, as shown in FIG. 9. As shown in FIG. 10, a second dielectric material layer 114' is disposed over the first dielectric material layer 114 and the first conductive traces 124. As shown in FIG. 11, at least one second conductive trace 124' is formed on the second dielectric material layer, 114' using a patterned second resist layer 122', in a manner previously described. The second conductive traces 124' extend through the second dielectric material layer 114' to contact a respective first conductive trace 124. A third dielectric material layer 114" is disposed over the second resist layer 122' and the second conductive traces 124'. First solder ball lands 126 (illustrated as a trace 127 having solder 129 disposed thereon) are formed using a patterned third resist layer 122" to extend through the third dielectric material layer 114". A first solder resist 128 may be formed over the third resist layer 122" to surround the first solder ball lands 126, thus forming a top trace network 144. It is, of course, understood the each of the first resist layer 122, the second resist layer 122', and the third resist layer 122" could have been removed.

Figure 12:
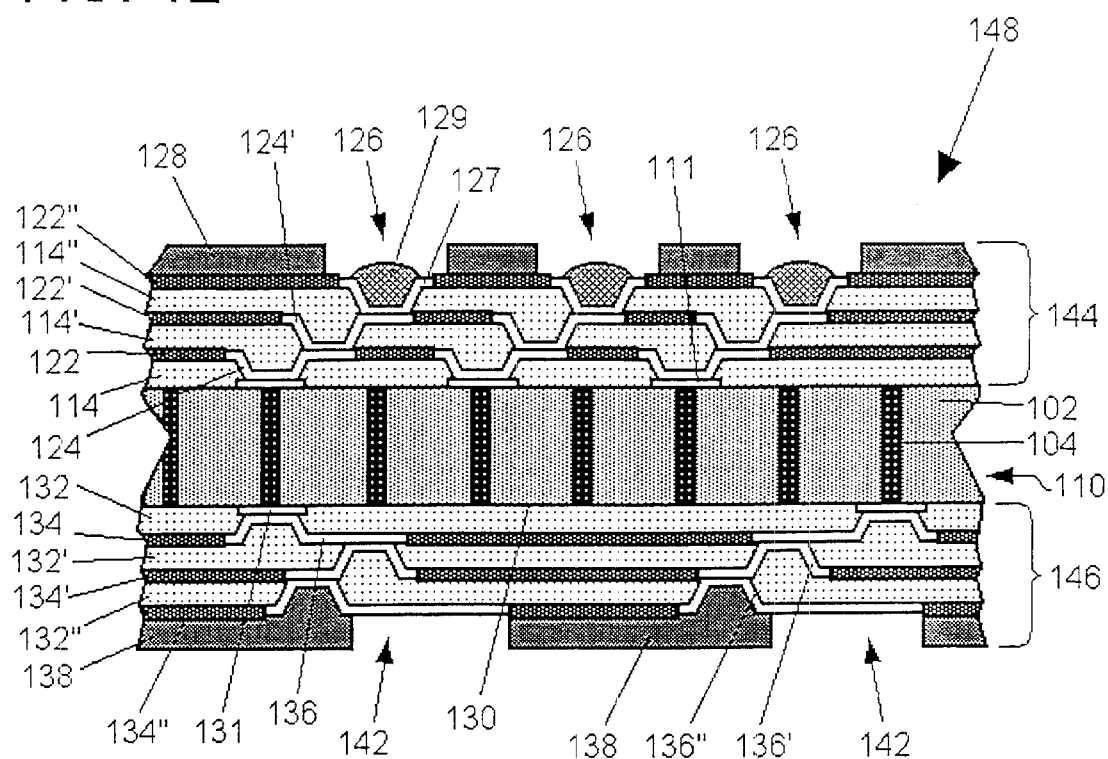

As shown in FIG. 12, a bottom trace network 146 may be formed on the parallel plane substrate second surface 130 in a similar fashion as the top trace network 144 with conductive lands 131, first, second, and third dielectric material layers (132, 132', and 132", respectively), first, second, and third resist layers (134, 134', and 134", respectively), and first, second, and third conductive traces (136, 136', and 136", respectively), wherein second solder ball lands 142 are formed with the third conductive traces 136" and a second solder resist 138 is formed over the third resist layer 134" and a portion of the third conductive trace 136" to surround the second solder ball lands 142. This results in an interposer 148, as shown in FIG. 12. It is, of course, understood that although three layers of dielectric material and conductive traces are illustrated, the present invention is not so limited. There may be any number of such layers greater or less than three.

It is noted that the first conductive trace 124 of the top trace network 144 need not be vertically aligned with a corresponding first conductive trace 136 of the bottom trace network 146 (between which electrical communication is desire). The first conductive trace 114 of the top trace network 144 and its corresponding first conductive trace 136 of the bottom trace network 146 need only contact a common substrate conductive material layer 104 anywhere along a length (perpendicular to FIG. 12) of the substrate conductive material layer 104.

Figure 13:
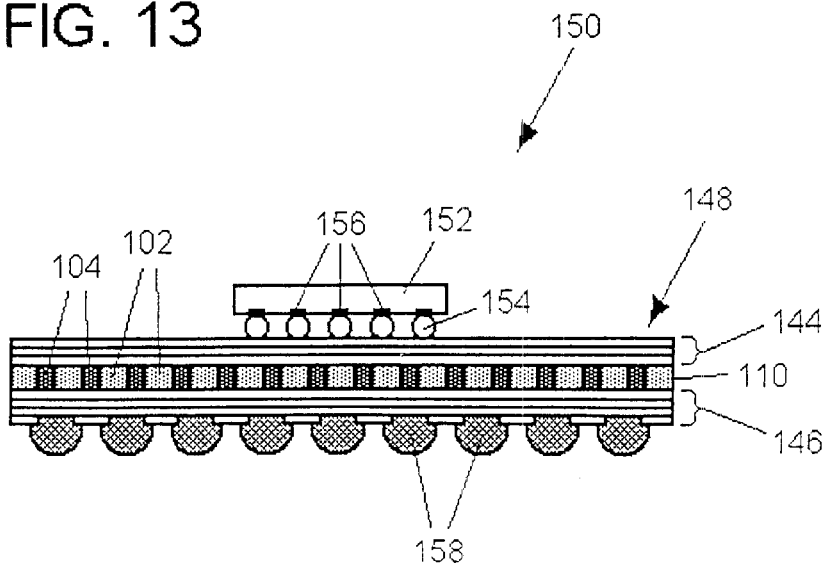
FIG. 13 is a side cross-sectional view of a microelectronic package, according to the present invention.

FIG. 13 illustrates a microelectronic package 150 comprising a microelectronic die 152 is attached to and in electrical contact with the top trace network 144 of the parallel plane substrate 110 through small solder balls 154. The small solder balls 154 extend between contacts 156 on the microelectronic die 152 and the first solder ball lands 126 (see FIG. 12) of the top trace network 144. External contacts 158 (shown as solder balls) are formed on the second solder ball lands 142 (see FIG. 12) of the bottom trace network 146. Of course, this invention is not limited to microelectronic dice 152 connected through solder balls 154, as illustrated in FIG. 13. The microelectronic die 152 can be connected through wire bonds or other connection technique known to those familiar with the art.

It is, of course, understood that multiple microelectronic dice could be connected to discrete top trace networks on a large parallel plane substrate 110, which is diced to form discrete packages, such as shown in FIG. 13

Figure 14:
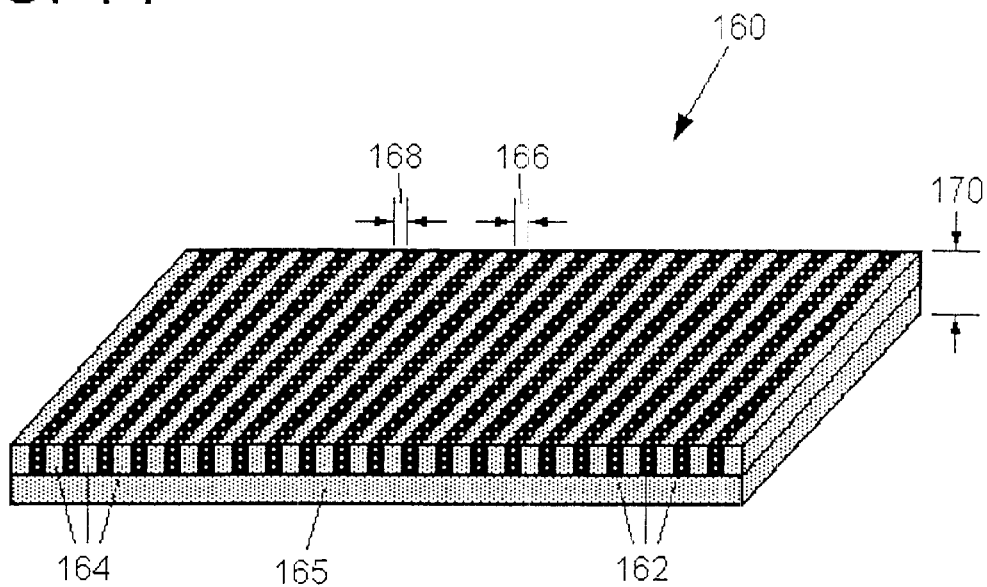
FIG. 14 is an oblique view of a first alternate substrate layer, according to the present invention.

The present invention is not limited to the substrate conductive material layer 104 being, a conductive across the entire layer. For example, one embodiment of the present invention may be a first intermittent conductive material layer 160, as illustrated in FIG. 14. The first intermittent conductive material layer 160 comprises a dielectric substrate 165 (such as a FR4 or BT resin substrate) having alternating sections of conductive material 162 (such as copper), for example about 0.1651 mm (6.5 mils) wide 166, and dielectric material 164 (such as a filled epoxy resin), for example about 0.1524 mm (6.0 mils) wide 168, formed thereon. The first intermittent conductive material layer 160 itself may be about 0.3175 mm thick 170. The first inteofittent conductive material layer 160 may be fabricated in the same manner as a single layer printed circuit boards are fabricated using standard print circuit board fabrication equipment, as well known in the art. As will be seen, the use of intermittent conductive material layer 160 in the fabrication of a substrate results discrete conductive vias extending through the substrate rather than a conducting plane as with the embodiment shown in FIG. 3.

Figure 15:
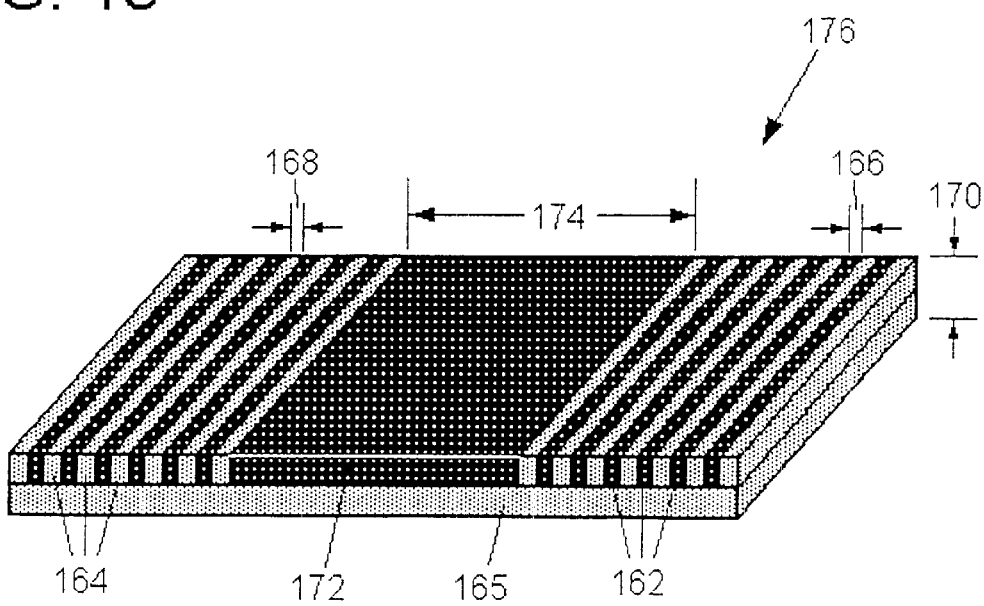
FIG. 15 is an oblique view of a second alternate substrate layer, according to the present invention.

Furthermore, the conductive material width 166 or the dielectric material width 168 may be varied. As illustrated in FIG. 15, a wide section of conductive material 172, for example about 16.9 mm (665.4 mils) wide 174 may be fabricated amid the alternating sections the conductive material 162 and the dielectric material 164 as described in FIG. 14 to form a second intermittent conductive material layer 176. The wide section of conductive material 172 may be used to carry a power supply (preferably located directly below a microelectronic die in a final assembly) and the sections of conductive material 162 may be used to carry electronic signals.

Figure 16:
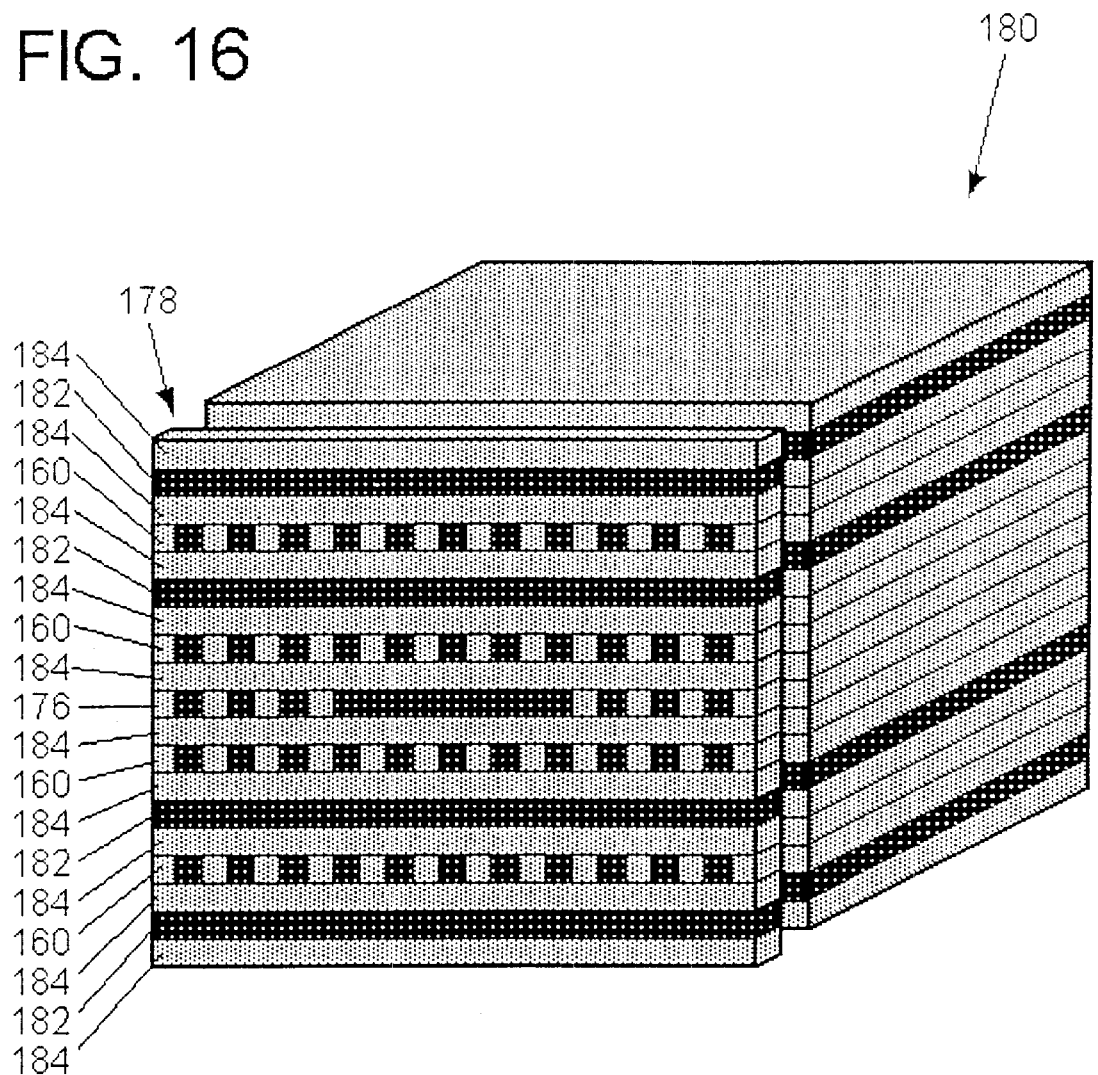
FIG. 16 is an oblique view of an alternate parallel plane substrate having been cut from a block including the first alternate substrate layers of FIG. 14 and the second alternate substrate layers of FIG. 15, according to the present invention.

FIG. 16 illustrates an oblique view of a substrate 178 having been cut from substrate block 180 which has incorporated the first intermittent conductive material layer 160 and the second intermittent conductive material layer 176 embodiments, as illustrated in FIGS. 14 and 15, and may include planar conductive material layers 182(similar to substrate conductive material layer 104 of FIGS. 1–13). The first intermittent conductive material layers 160, the second intermittent conductive material layers 176, and the planar conductive material layers 182 are separated by dielectric material layers 184.

Figure 17:
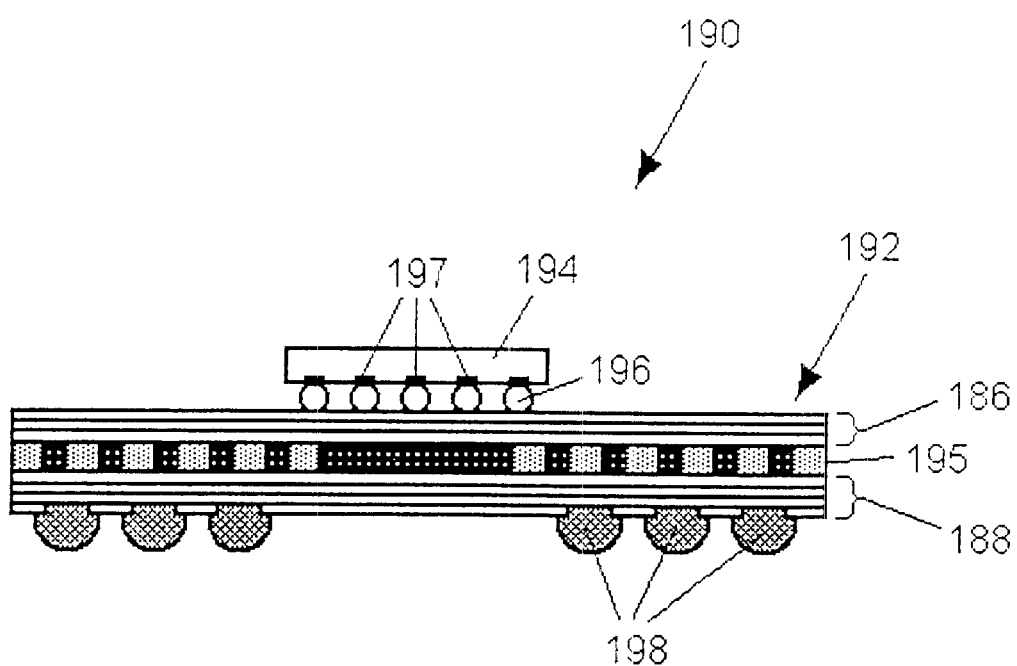
FIG. 17 is a side cross-sectional view of a microelectronic package, according to the present invention.
Figure 18:
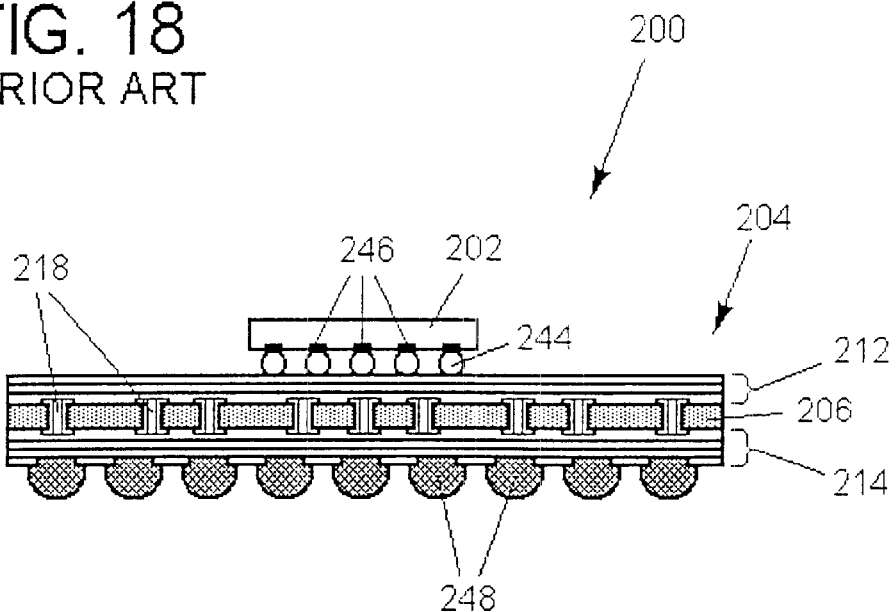
FIG. 18 is a side cross-sectional view of a microelectronic package, as known in the art.
Figure 19:
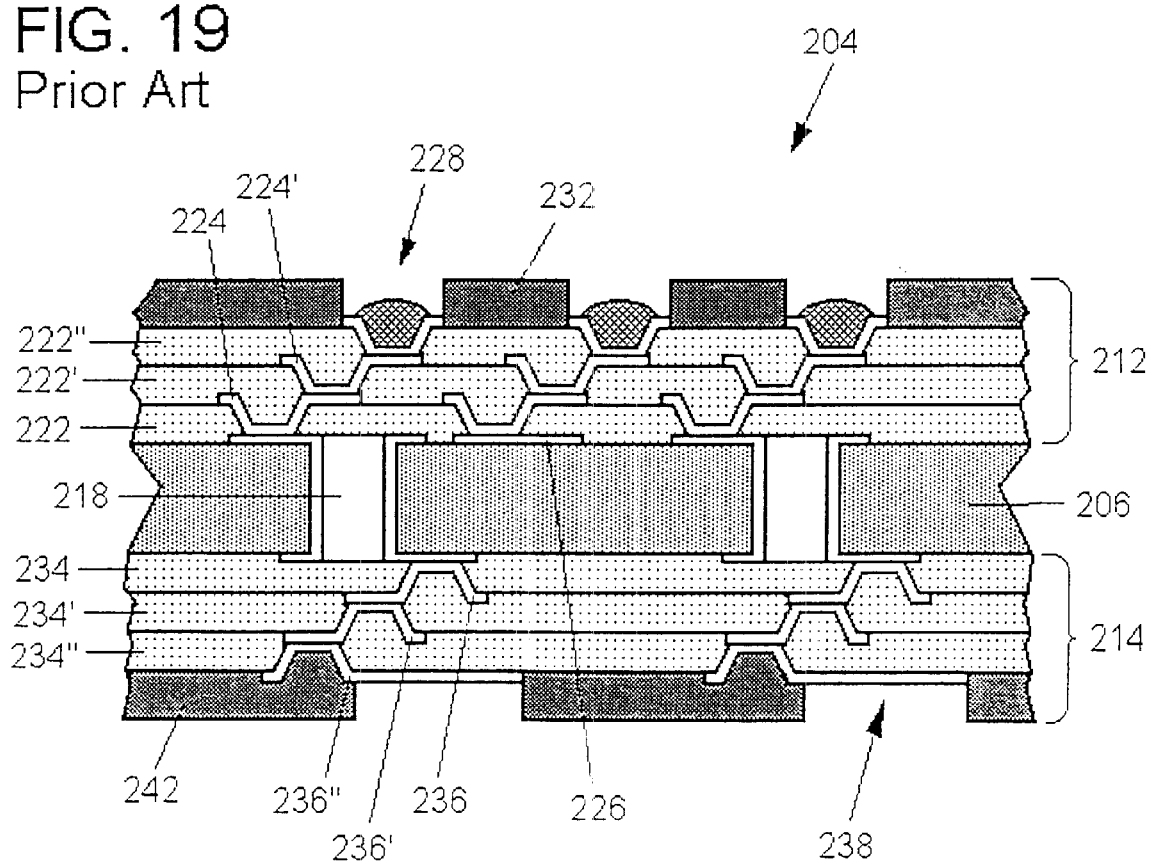
FIG. 19 is a side cross-sectional view of a plated through-hole. via in the interposer and the top and bottom trace networks of FIG. 18, as known in the art.
Figure 20:
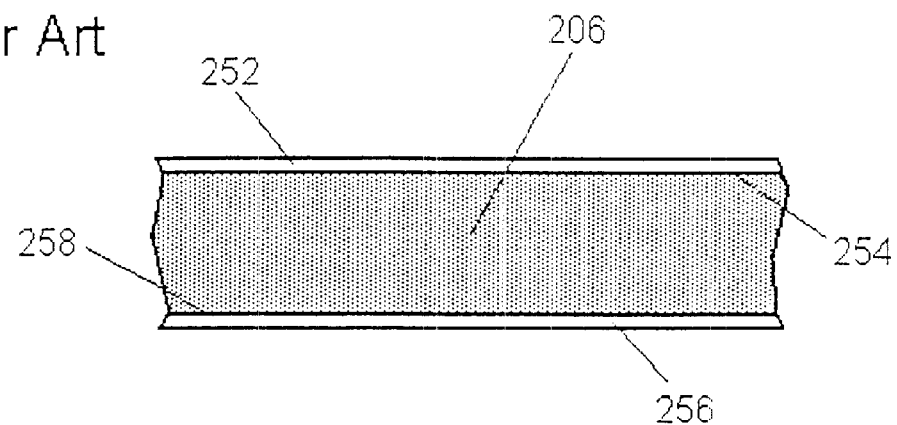
FIGS. 20–24 are side cross-sectional views of a method of fabricating a plated through-hole via, as known in the art.
Figure 21:
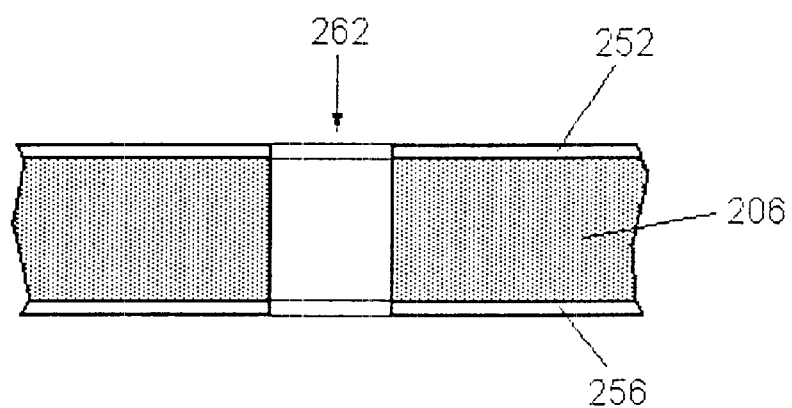
Figure 22:
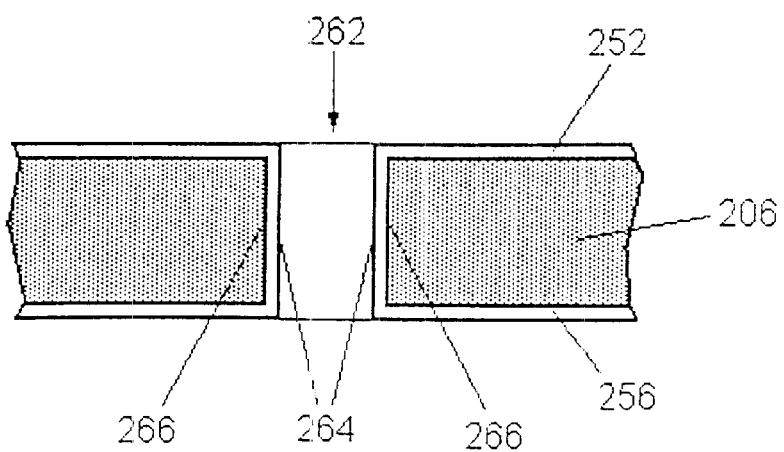

As shown in FIG. 17, a microelectronic package 190 may be fabricated by forming a top trace network 186 and a bottom trace network 188 on a substrate 195 similar to that shown in FIG. 16 to fabricate an interposer 192 (similar to interpose 148, as shown in FIG. 12). A microelectronic die 194 is attached to and in electrical contact with the top trace network 186 through small solder balls 196. The small solder balls 196 extend between contacts 197 on the microelectronic die 194 and the top trace network 186. External contacts 198 (shown as solder balls) are formed on the bottom trace network 188.

With regard to the present invention in general, due to the placement of numerous parallel planes in close proximity to each other, the current supplied to the microelectronic die for the purpose of supplying power, follows a path of lower inductance and lower resistance than would be typical in a standard multilayer package with plated through holes. In addition, the signal traces going through the parallel plane core are shielded from one another in a manner that is superior to that in a standard multilayer package with plated through holes. As illustrated in FIG. 16, this results from the fact that the signal traces going through the parallel plane core are surrounded on all four sides by a reference plane held at either the ground or supply voltage level. This isolation is not possible in a standard multilayer package with plated through holes.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a microelectronic substrate, comprising:

layering alternating substantially planer dielectric material layers and conductive material layers to form a block, wherein layering said conductive layers comprised layering at least one intermittent conductive material layer;

slicing a section from said block perpendicular to said planar dielectric material layers and said conductive material layers.

2. The method of claim 1, wherein layering said conductive layers comprises layering at least one continuous conductive material layer.

3. The microelectronic substrate of claim 1, wherein layering said at least one intermittent conductive material layer comprises layering said at least one intermittent conductive material layer having alternating sections of conductive material and dielectric material.

4. A method of fabricating a microelectronic device, comprising:

layering alternating substantially planar dielectric material layers and conductive material layers to form a block, wherein layering said conductive layers comprises layering at least one intermittent conductive material layer;

slicing a section from said block perpendicular to said planar dielectric material layers and said conductive material layers to provide a substrate having a first surface and a second surface; and disposing a trace network on at least one of said substrate first surface and said substrate second surface.

5. The method of claim 4, wherein disposing said trace network comprises disposing at least one dielectric layer on said substrate first surface, and further including disposing at least one conductive trace on and extending through said at least one first surface dielectric layer to contact at least one substrate conductive material layer.

6. The method of claim 5, further including disposing a second trace network on said substrate second surface comprising at least one conductive trace disposed on said at least one second surface dielectric layer and extending through said at least one second surface dielectric layer to contact at least one substrate conductive material layer.

7. The method of claim 4, further including attaching at least one microelectronic die attached to said trace network.

8. The method of claim 4, wherein layering said conductive layers comprises layering at least one continuous conductive material layer.

9. The method of claim 4, wherein layering said at least one intermittent conductive material layer comprises layering said at least one intermittent conductive material layer having alternating sections of conductive material and dielectric material.

* * * * *

UNITED STATES PATENT AND TRADEMARK OFFICE
CERTIFICATE OF CORRECTION

PATENT NO. : 6,632,734 B2
DATED : October 14, 2003
INVENTOR(S) : Sankman

It is certified that error appears in the above-identified patent and that said Letters Patent is hereby corrected as shown below:

Title page, Item [54] and Column 1, line 1,
Title, delete "PARALLEL PLANE SUBSTRATE" and insert -- METHOD OF FABRICATING A MICROELECTRONIC PARALLEL PLANE SUBSTRATE --.

Title page,
Item [57], ABSTRACT,
Replace ABSTRACT with -- A microelectronic substrate having a plurality of alternating substantially planar layers of dielectric material and conductive material, and further having a first surface and a second surface, wherein the dielectric material and the conductive material layers extend substantially perpendicularly between the first and second surfaces --.

Figure 23:
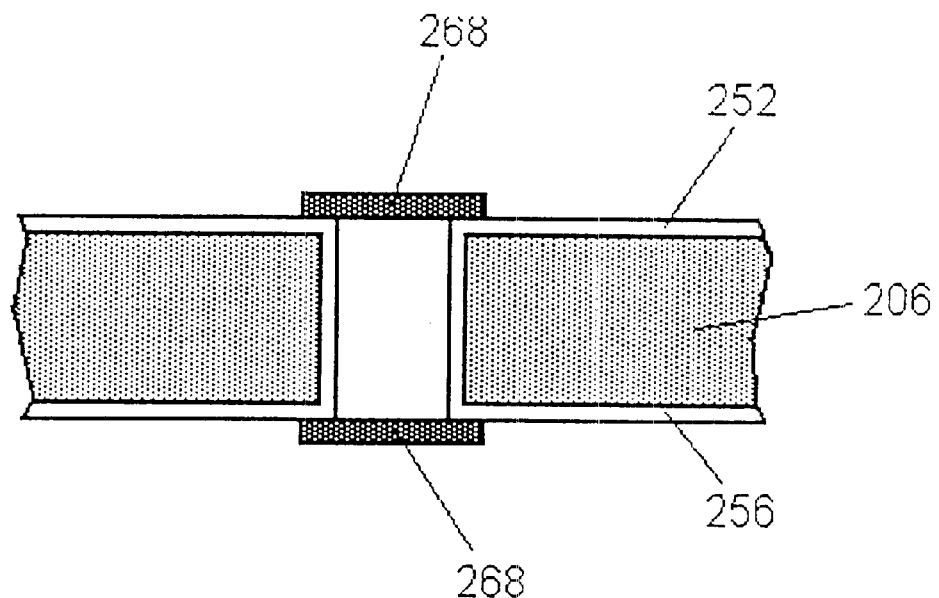
Figure 24:
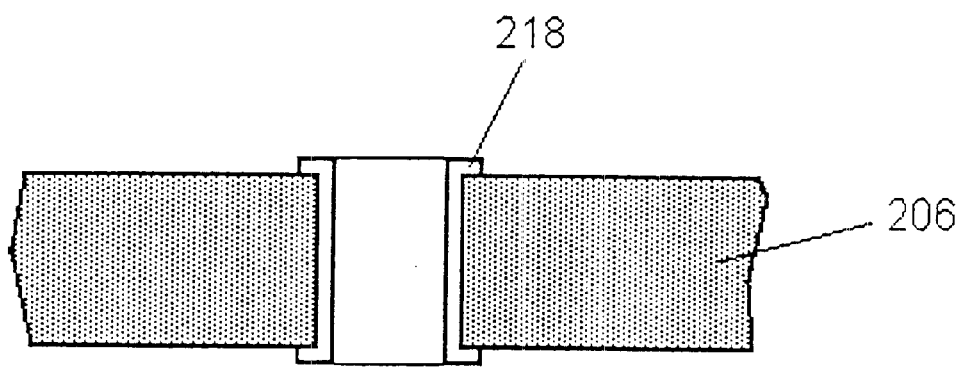

Column 2,
Line 10, insert -- an -- after the word "and".
Line 10, insert -- . -- at the end of the line.
Line 20, delete "electrodeless" and insert -- electroless --.
Line 21, delete "electroplatin" and insert -- electroplating --.
Line 25, delete "as" before "FIG 23".

Column 3,
Line 31, delete "alone" and insert -- along --.

Column 4,
Line 60, delete "." after the word "material".

Column 6,
Line 4, delete "inteofitent" and insert -- intermittent --.

UNITED STATES PATENT AND TRADEMARK OFFICE
CERTIFICATE OF CORRECTION

PATENT NO. : 6,632,734 B2
DATED : October 14, 2003
INVENTOR(S) : Sankman

It is certified that error appears in the above-identified patent and that said Letters Patent is hereby corrected as shown below:

Column 7,
Line 6, delete "comprised" and insert -- comprises --.

Signed and Sealed this

Ninth Day of March, 2004

JON W. DUDAS
*Acting Director of the United States Patent and Trademark Office*